United States Patent
Underhill et al.

(10) Patent No.: US 11,802,919 B2
(45) Date of Patent: Oct. 31, 2023

(54) SYSTEMS AND METHODS FOR REMOTELY TESTING CONTINUITY OF ELECTRICAL WIRING

(71) Applicant: Rivian IP Holdings, LLC, Plymouth, MI (US)

(72) Inventors: Kyle R. Underhill, Los Angeles, CA (US); Steven E. Schulz, Torrance, CA (US); Silva Hiti, Redondo Beach, CA (US); Tyler J. Erikson, Torrance, CA (US)

(73) Assignee: Rivian IP Holdings, LLC, Plymouth, MI (US)

( * ) Notice: Subject to any disclaimer, the term of this patent is extended or adjusted under 35 U.S.C. 154(b) by 342 days.

(21) Appl. No.: 17/101,376

(22) Filed: Nov. 23, 2020

(65) Prior Publication Data

US 2022/0163603 A1      May 26, 2022

(51) Int. Cl.
| | |
|---|---|
| *B60L 53/18* | (2019.01) |
| *B60L 53/62* | (2019.01) |
| *B60L 53/68* | (2019.01) |
| *G01R 31/54* | (2020.01) |
| *G01R 31/66* | (2020.01) |

(52) U.S. Cl.
CPC .............. *G01R 31/54* (2020.01); *B60L 53/18* (2019.02); *B60L 53/62* (2019.02); *B60L 53/68* (2019.02); *G01R 31/66* (2020.01)

(58) Field of Classification Search
CPC .......... B60L 53/14; B60L 53/16; B60L 53/18; B60L 53/62; B60L 53/68; G01R 31/54; G01R 31/66
See application file for complete search history.

(56) References Cited

U.S. PATENT DOCUMENTS

| 2012/0029728 A1* | 2/2012 | Hirayama | B60L 53/66 701/1 |
| 2019/0329666 A1* | 10/2019 | Kodama | B60L 53/16 |

* cited by examiner

*Primary Examiner* — David V Henze-Gongola
(74) *Attorney, Agent, or Firm* — Clements Bernard Walker; Christopher L. Bernard

(57) ABSTRACT

Various disclosed embodiments include illustrative systems for remotely testing continuity of electrical wiring, electrical vehicle charging systems, and charge couplers for electrical vehicle charging systems. In an illustrative embodiment, a system for remotely testing continuity of electrical wiring includes a signal generator configured to generate a signal having a predetermined frequency. A controlled impedance network is configured to attenuate the signal. The controlled impedance network is electrically connectable toward a first end of electrical wiring that terminates at a termination at the first end and that is electrically connectable at a second end to the signal generator to carry the signal. A signal detector is configured to detect the signal.

11 Claims, 12 Drawing Sheets

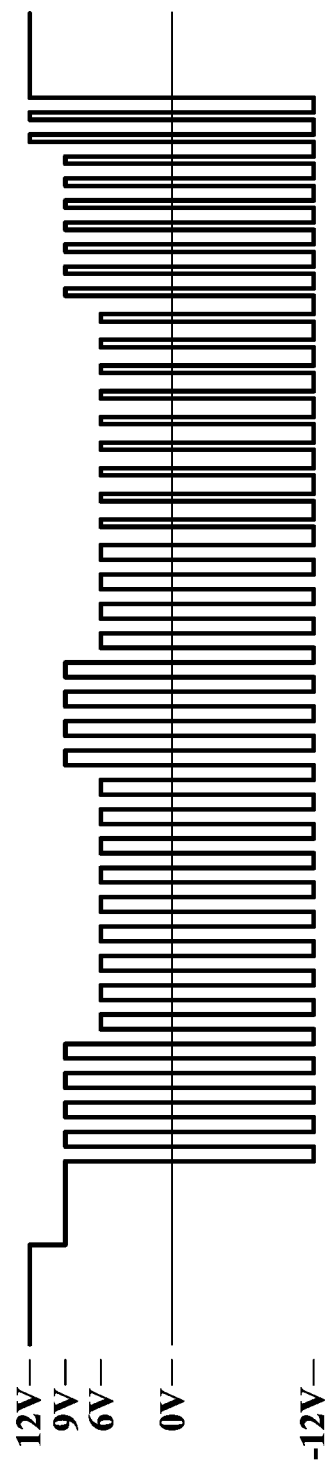

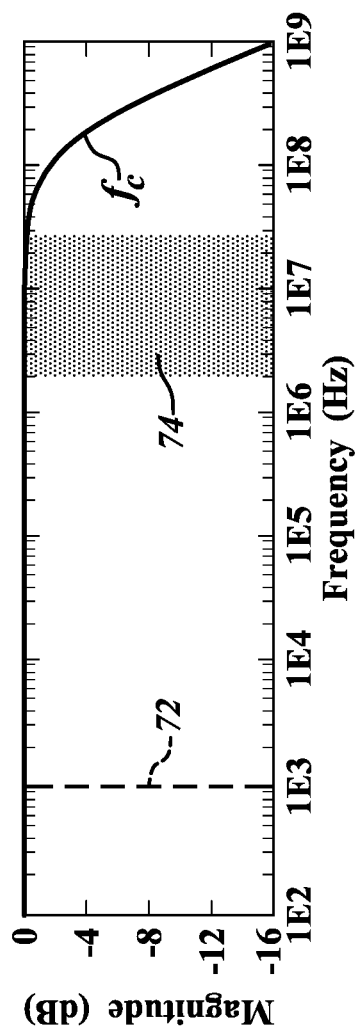
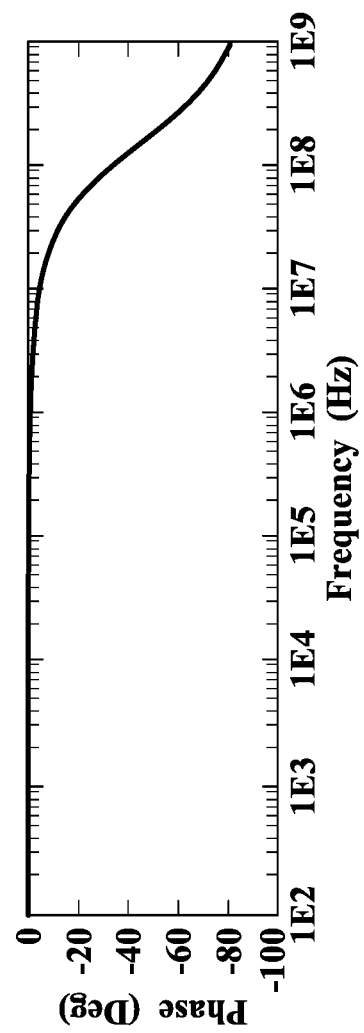

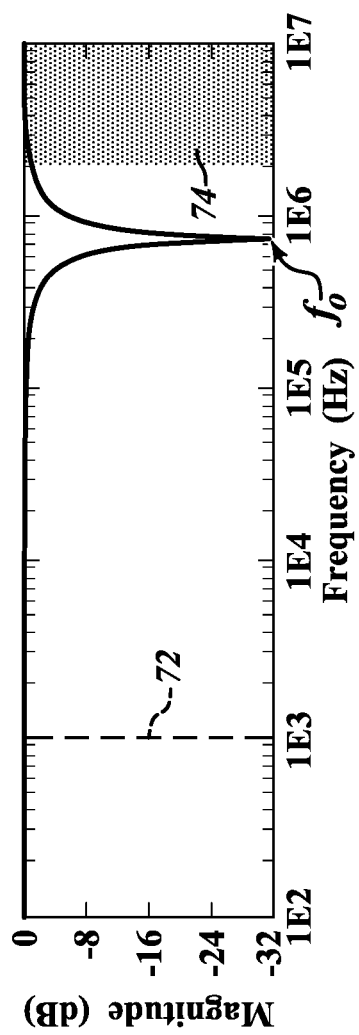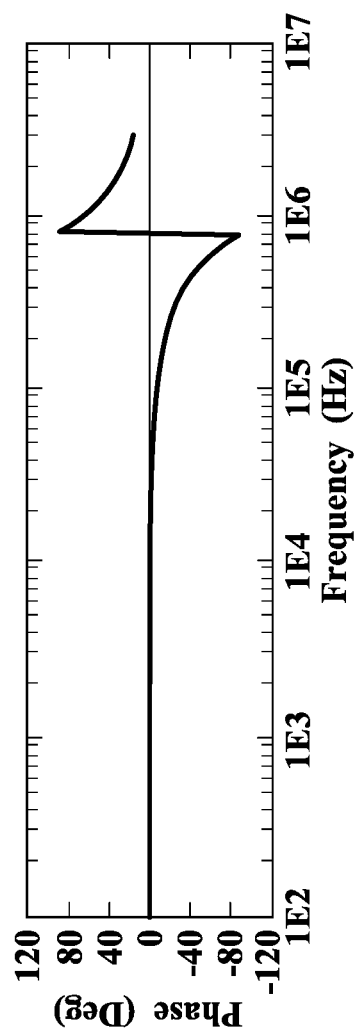

SYSTEMS AND METHODS FOR REMOTELY TESTING CONTINUITY OF ELECTRICAL WIRING

The present disclosure relates to testing continuity of electrical wiring. The statements in this section merely provide background information related to the present disclosure and may not constitute prior art.

In settings in which a user can access an electrical wire, the user may test continuity of the electrical wire easily by currently known devices and methods, such as by using any suitable continuity tester, multimeter, or the like. However, in other, remote settings in which a user cannot access an electrical wire, the user is not able to use test continuity of the electrical wire by use of currently known devices and methods like a continuity tester or a multimeter. Difficulty in remotely testing for continuity of electrical wiring is exacerbated when the electrical wiring terminates in a connector (that need not be connected to its associated mating connector and attendant electrical circuitry).

One example of a remote setting is a direct current (DC) fast charging station for charging an electric vehicle. In Level 3 charging (DC fast charging), alternating current (AC) electrical power is supplied from the electrical grid to Electric Vehicle Supply Equipment (EVSE). The EVSE also handles communication, but AC voltage is converted to DC voltage via an AC-to-DC converter that is disposed in the EVSE and that can have a rating of greater than 200 KW. With Level 3 DC fast charging, the AC-to-DC converter onboard the electric vehicle is bypassed, and up to around 195 miles of range are added per hour of charging. As such, Level 3 DC fast charging may be considered to be desirable for public charging infrastructure (such as charging stations for fleets of private vehicles and that are also available for use by the public—hereinafter referred to as public charging stations).

EVSE typically includes a power cabinet that receives AC electrical power from the grid and converts the grid AC electrical power to DC electrical power. The power cabinet provides the DC electrical power to at least one dispenser. Each dispenser includes a charge coupler that is electrically connected to the dispenser and that is electrically connectable to the electric vehicle to dispense DC electrical power to the electric vehicle. An electrical connection referred to as a control pilot provides a control pilot signal from the EVSE through the charge coupler to the electric vehicle to provide a communication integrity check between the EVSE and the electric vehicle.

Sometimes electric vehicles may have problems charging and it may be difficult to triage the reason remotely (for example, software issues versus hardware connection). Field service data shows that broken cables (that connect charge couplers to their dispensers) account for a majority of field service visits and replacement costs for public charging infrastructure. However, currently-known systems and methods require an electric vehicle to be connected to the EVSE (at least SAE J1772 State B1) to perform a communication integrity check between the EVSE and the electric vehicle. Currently-known systems and methods cannot perform a communication integrity check between the EVSE and the electric vehicle when the electric vehicle is not connected to the EVSE (SAE J1772 State A).

BRIEF SUMMARY

Various disclosed embodiments include illustrative systems for remotely testing continuity of electrical wiring, electrical vehicle charging systems, and charge couplers for electrical vehicle charging systems.

In an illustrative embodiment, a system for remotely testing continuity of electrical wiring includes a signal generator configured to generate a signal having a predetermined frequency. A controlled impedance network is configured to attenuate the signal. The controlled impedance network is electrically connectable toward a first end of electrical wiring that terminates at a termination at the first end and that is electrically connectable at a second end to the signal generator to carry the signal. A signal detector is configured to detect the signal.

In another illustrative embodiment, an electric vehicle charging system includes a dispenser configured to receive and dispense direct current (DC) electrical power. The dispenser includes at least one signal generator configured to generate a control pilot signal having a first frequency for low-level signaling, a powerline communication signal having a second frequency range for high-level communications, and a continuity check signal having a third frequency that is different from the first frequency and the second frequency range. A signal detector is configured to detect the continuity check signal. A cable assembly includes a control pilot wire electrically coupled to receive the control pilot signal, the powerline communication signal, and the continuity check signal and a ground wire electrically connectable to equipment ground. A charge coupler is coupled to an end of the cable assembly. The charge coupler includes a housing. A controlled impedance network is disposed in the housing and is electrically connected between the control pilot wire and the ground wire. The controlled impedance network is configured to attenuate the continuity check signal.

In another illustrative embodiment, a charge coupler for an electrical vehicle charging system includes a housing. DC contacts are disposed in the housing and are configured to be electrically coupled to dispense DC electrical power to an electric vehicle. A control pilot wire is disposed in the housing. The control pilot wire is configured to receive a control pilot signal having a first frequency for low-level signaling, a powerline communication signal having a second frequency range for high-level communications, and a continuity check signal having a third frequency that is different from the first frequency and the second frequency range. A ground wire is disposed in the charge coupler housing. The ground wire is configured to be electrically connectable to equipment ground. A controlled impedance network is electrically connected between the control pilot wire and the ground wire. The controlled impedance network is configured to attenuate the continuity check signal.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Illustrative embodiments are illustrated in referenced figures of the drawings. It is intended that the embodiments and figures disclosed herein are to be considered illustrative rather than restrictive.

FIG. 3D is a graph of voltage versus time for an illustrative control pilot signal for low-level signaling.

FIGS. 4B and 4C are graphs of response of the low pass filter of FIG. 4A.

FIGS. 5B-5E are graphs of response of the notch filter of FIG. 5A.

Like reference symbols in the various drawings generally indicate like elements.

DETAILED DESCRIPTION

Figure 1:
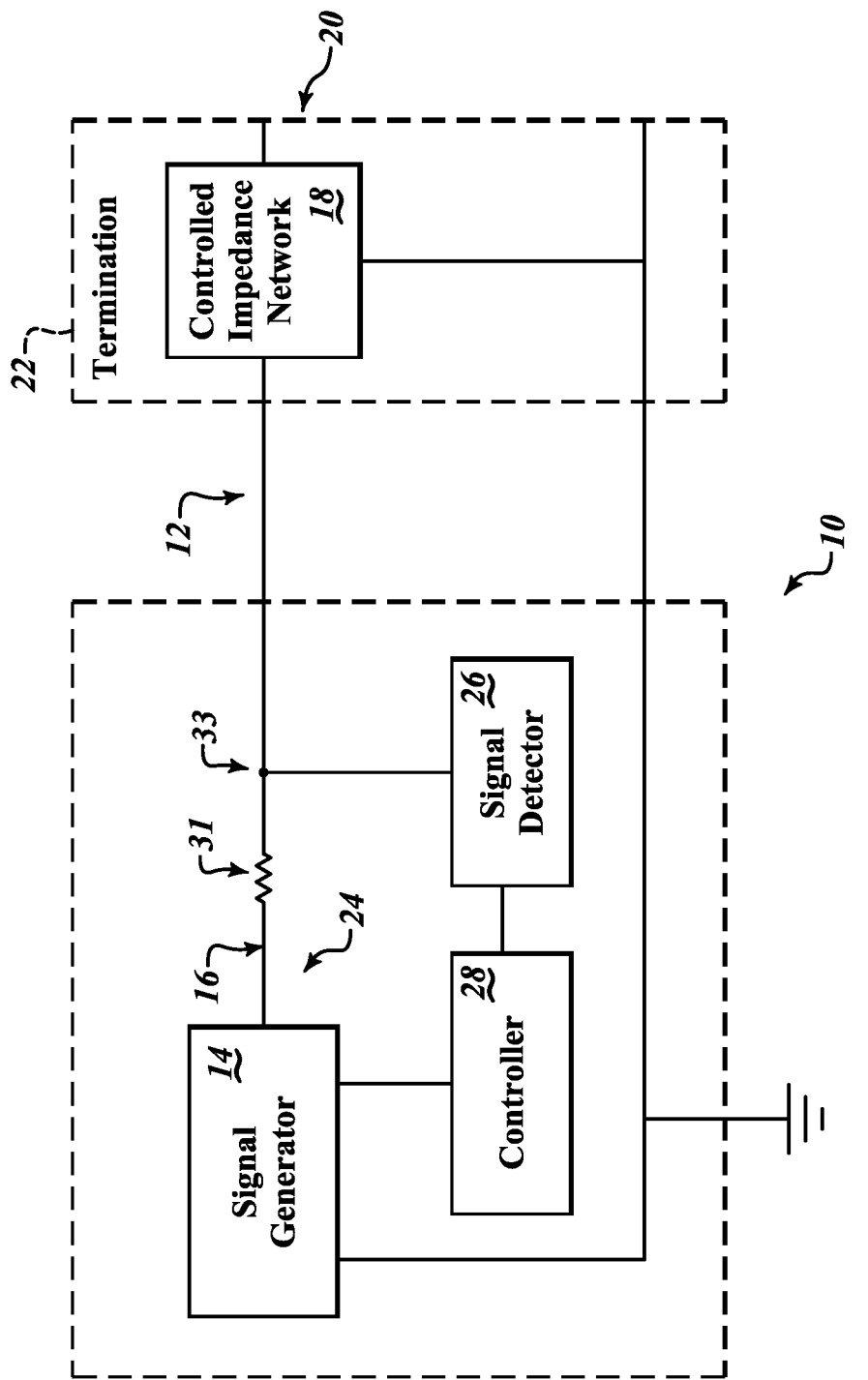
FIG. 1 is a block diagram of an illustrative system for remotely testing continuity of electrical wiring.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Various disclosed embodiments include illustrative systems for remotely testing continuity of electrical wiring, electrical vehicle charging systems, and charge couplers for electrical vehicle charging systems.

Referring now to FIG. 1 and given by way of overview, in various embodiments an illustrative system 10 for remotely testing continuity of electrical wiring 12 includes a signal generator 14 configured to generate a signal 16 having a predetermined frequency. A controlled impedance network 18 is configured to attenuate the signal 16. The controlled impedance network 18 is electrically connectable toward an end 20 of the electrical wiring 12 that terminates at a termination 22 at the end 20 and that is electrically connectable at an end 24 to the signal generator 14 to carry the signal 16. A signal detector 26 is configured to detect the signal 16.

As will be explained below, various embodiments can help provide testing continuity of the electrical wiring 12. Still referring to FIG. 1 and still by way of overview, it will be further appreciated that, in various embodiments, if the electrical wiring 12 is continuous and the signal 16 is applied to the electrical wiring 12, then the controlled impedance network 18 will attenuate the signal 16 and the signal detector 26 will measure the attenuated signal 16. It will also be appreciated that, in various embodiments, if the electrical wiring 12 is not continuous and the signal 16 is applied to the electrical wiring 12, then the signal detector 26 measures the full-strength signal 16 with little, minimal, or no attenuation.

Now that an overview has been set forth, illustrative details will be explained by way of examples that are given by way of illustration only and not of limitation.

Still referring to FIG. 1, it will be appreciated that the electrical wiring 12 may be any type of electrical wiring as desired for a particular application. No limitation whatsoever to any type of electrical wiring is intended and no limitations should be inferred. For purposes of clarity and brevity, a non-limiting example will be given below by way of illustration only and not of limitation in which the electrical wiring 12 is a control pilot wire suitable for use in an electric vehicle charging system. Again, it is emphasized that the electrical wiring 12 is not to be limited to the non-limiting, illustrative example discussed below.

In various embodiments the electrical wiring 12 terminates at the termination 22 at the end 20. The termination 22 may be any suitable termination as desired for a particular application, such as a connector, a plug, a jack, an end of the wire (insulated or stripped), or the like. In various embodiments the end 24 of the electrical wiring 12 is electrically connectable to the signal generator 14 in any suitable manner as desired for a particular application. In some embodiments the end 24 may be connectorized, such as with a suitable connector, plug, jack, or the like, for electrical connection to the signal generator 14. In some other embodiments, the end 24 may be hard wired to the signal generator 14 in any suitable manner as desired for a particular application. Regardless, in various embodiments the controlled impedance network 18 is disposed toward the end 20 of the electrical wiring 12 and, in some embodiments, may be disposed in the termination 22.

In various embodiments the signal generator 14 is any suitable signal generator or generators as desired for a particular application, such as an oscillator, a general purpose signal generator, a function generator, a digital pattern generator, a radio frequency (RF) transmitter, or the like. The signal 16 that is generated by the signal generator 14 may be any suitable signal as desired for a particular application, such as without limitation a sine wave, a square wave, a sawtooth wave, a step (pulse) wave, a triangular wave, digital logic signals, an combination thereof, and/or the like. In some embodiments the signal generator 14 may be provided as a free-standing self-contained instrument, as a component of a device, subsystem, or system, and/or may be implemented as a digital signal processor that is configured to synthesize waveforms (the output of which may be input to a digital-to-analog converter (DAC) as desired for a particular application).

In various embodiments, the signal generator 14 generates the signal 16 that is used for testing continuity of the electrical wiring 12. In some embodiments the signal generator 14 generates only the signal 16. In some other embodiments, the signal generator 14 may be configured to generate signals in addition to the signal 16. In some such embodiments, if desired generation of any such additional signals may be disabled while the signal 16 is generated.

In some embodiments the electrical wiring 12 carries at least one additional electrical signal in addition to the signal 16. In some such embodiments the signal generator 14 may generate the signal 16 and the additional signal(s). In some other such embodiments the additional signal(s) may be provided by a source other than the signal generator 14. Regardless of the source of the additional signal(s), in embodiments in which the electrical wiring 12 carries the additional signal(s) it will be appreciated that frequency of the signal 16 and resultant component selection and frequency response of the controlled impedance network 18 are selected such that the signal 16 and the controlled impedance network 18 do not interfere with the additional signal(s). As will be explained below, in various embodiments interference between the signal 16 and the controlled impedance network 18 with the additional signal can be avoided by selecting frequency of the signal 16 to be sufficiently different from the frequency (or frequencies) of the additional signal(s). When coupled with appropriate component selection and frequency response of the controlled impedance network 18, a frequency of the signal 16 that is sufficiently different from the frequency (or frequencies) of the additional signal(s) can help enable the signal 16 to not interfere with the additional signal(s).

In various embodiments the signal detector 26 includes any suitable signal detector selected for a particular application. In some embodiments, the signal detector 26 may include any suitable voltage detector (whether separate instrument or a component of a device), any suitable analog signal detector, a suitable digital electronics component configured to sample the signal 16, and/or the like.

In some embodiments the signal generator 14 and/or the signal detector 26 may be controlled by a controller 28. In such embodiments, the controller 28 may include any suitable computer-processor-based controller as desired for a particular application. Controllers are very well known and, as a result, description of construction and operation of the controller 28 is not necessary for an understanding of disclosed subject matter.

Figure 4A:
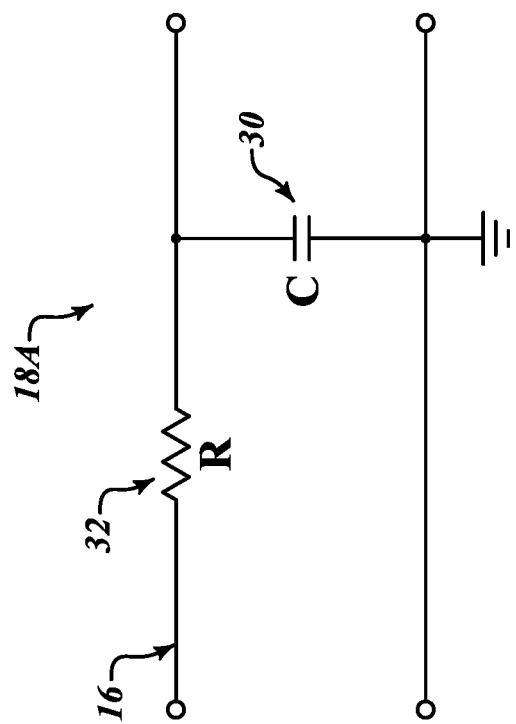
FIG. 4A is a schematic diagram of an illustrative low pass filter.
Figure 5A:
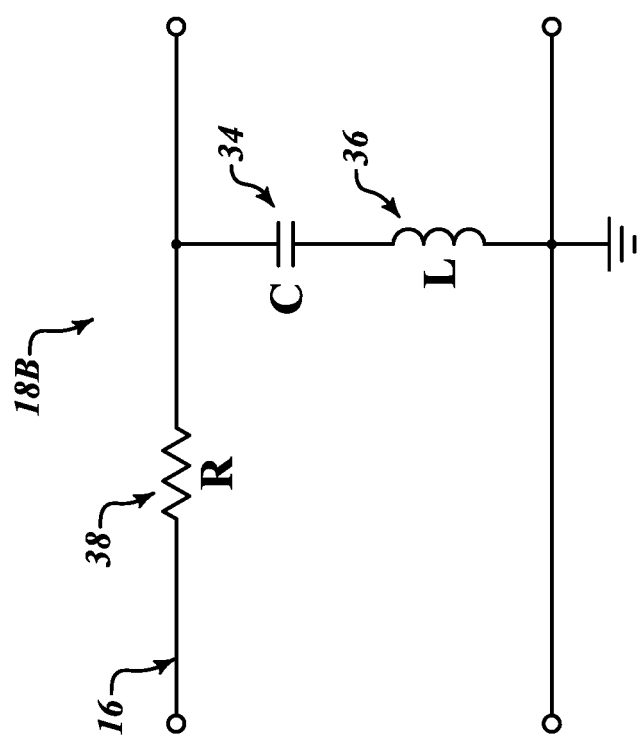
FIG. 5A is a schematic diagram of an illustrative notch filter.

Referring additionally to FIGS. 4A and 5A, in some embodiments the controlled impedance network 18 may include a low pass filter 18A (FIG. 4A) and in some other embodiments the controlled impedance network 18 may include a notch filter 18B. Both of these illustrative, non-limiting embodiments will be discussed below.

As shown in FIG. 4A, in some embodiments the controlled impedance network 18 includes the low pass filter 18A disposed in the termination 22. In such embodiments the low pass filter 18A includes a capacitor 30 electrically connected between the wires of the electrical wiring 12.

It will be appreciated that the signal detector 26 measures the signal 16 after some impedance to see the effect of the controlled impedance network 18 effectively shorting the signal 16. To that end, in various embodiments a resistor 31 is disposed between the output of the signal generator 14 and a node 33 at which the signal detector 26 measures the signal 16.

In some embodiments, if desired the low pass filter 18A may also include an optional, additional current-limiting resistor 32 disposed in-line with the electrical wiring 12 in the termination 22. In some other embodiments, the current-limiting resistance of the resistor 31 may be deemed sufficient and the optional resistor 32 is not used.

As mentioned above, in some embodiments the electrical wiring 12 may carry at least one additional electrical signal in addition to the signal 16. It will be appreciated that, in such embodiments, the signal 16 is generated when any additional electrical signals are disabled. In such embodiments the low pass filter 18A has a cutoff frequency $f_c$ that is sufficiently above the highest frequency of the additional signal(s) such that the low pass filter 18A does not interfere with the additional signal(s). A non-limiting example of such a case will be discussed below by way of illustration only and not of limitation.

As shown in FIG. 5A, in some embodiments the controlled impedance network 18 includes the notch filter 18B disposed in the termination 22. In such embodiments the notch filter 18B includes a capacitor 34 electrically connected in series with an inductor 36. The series combination of the capacitor 34 and the inductor 36 is electrically connected between the wires of the electrical wiring 12. The notch filter 18B has a stop band frequency range having a center frequency $f_0$ at which impedance of the capacitor 34 and impedance of the inductor 36 cancel each other.

As discussed above, the signal detector 26 measures the signal 16 at the node 33 after the resistor 31 that is disposed between the output of the signal generator 14 and the node 33. In some embodiments, if desired the notch filter 18B may also include an optional, additional current-limiting resistor 38 disposed in-line with the electrical wiring 12 in the termination 22. In some other embodiments, the current-limiting resistance of the resistor 31 may be deemed sufficient and the optional resistor 38 is not used.

As mentioned above, in some embodiments the electrical wiring 12 may carry at least one additional electrical signal in addition to the signal 16. As also mentioned above, in such embodiments the signal 16 is generated when any additional electrical signals are disabled. In some such embodiments in which only one additional signal is provided, the center frequency $f_0$ is sufficiently above the additional signal's frequency such that the notch filter 18B does not interfere with the additional signal. In some other such embodiments in which two (or more) additional signals with different frequencies are provided, the center frequency $f_0$ is between the different frequencies of the additional signals. A non-limiting example of such a case will be discussed below by way of illustration only and not of limitation.

Regardless of whether any additional electrical signals are generated or if the controlled impedance network 18 includes the low pass filter 18A or notch filter 18B, it will be appreciated that continuity (that is, no breaks in the electrical wiring 12 including the ground wires) can be distinguished from discontinuity (that is, a break in the electrical wiring 12 including the ground wires). Continuity is detected when the signal 16 is injected, is attenuated by the controlled impedance network 18, and the signal detector 26 measures the attenuated signal. Discontinuity is detected when the signal 16 is injected and the signal detector 26 measures a full strength signal with little, minimal, or no attenuation.

Referring additionally to FIGS. 2, 3A-3E, 4B, 4C, 5B, and 5C, in various embodiments an illustrative electric vehicle charging system 50 is able to test continuity of electrical wiring without the electrical wiring being connected to a vehicle. It will be appreciated that the electric vehicle charging system 50 is provided by way of illustration only and not of limitation.

Figure 2:
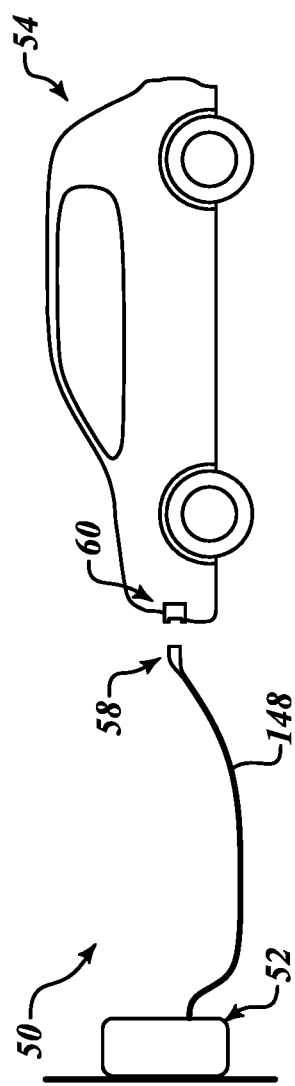
FIG. 2 is a block diagram in partial schematic form of an illustrative DC electrical power dispenser and an illustrative electrical vehicle.

As shown in FIG. 2, in various embodiments the electric vehicle charging system 50 includes a dispenser 52 configured to receive direct current (DC) electrical power and dispense DC electrical power to an electric vehicle 54 via a cable 148 and a charge coupler 58. The charge coupler 58 connects to the electric vehicle 54 via a vehicle interface 60. As will be explained below, in various embodiments continuity of wiring in the cable 148 that carries a control pilot signal can be tested when the charge coupler 58 is disconnected from the vehicle interface 60.

Figure 3A:
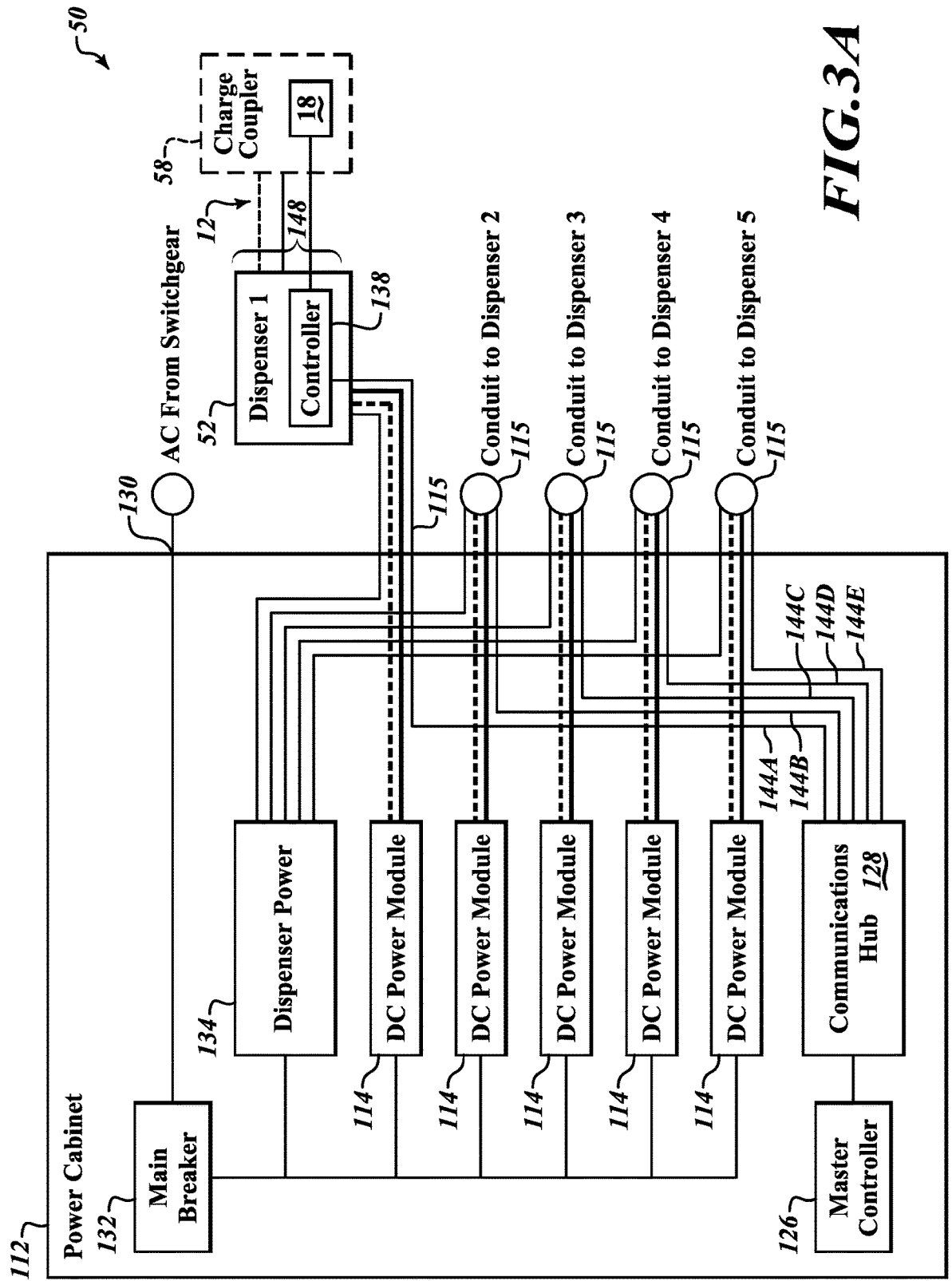
FIG. 3A is a block diagram of an illustrative electric vehicle charging system.

As shown in FIG. 3A and given by way of non-limiting example, in various embodiments the charging system 50 includes a power cabinet 112 having at least one direct current (DC) power module 114. The electrical power dispenser 52 is electrically coupled to the power cabinet 112. The charge coupler 58 is configured to dispense DC electrical power.

As also shown in FIG. 3A, in various embodiments the power cabinet 112 has a master controller 126 that is coupled to a communications hub 128. At least one DC power module 114 converts alternating current (AC) electrical power from an AC electrical power input 130 which passes through a main breaker 132 before being sent to the DC power modules 114 and a dispenser power module 134 (which provides working power to various electronics in the dispenser 52).

In various embodiments, the power cabinet 112 may include up to five (5) DC power modules 114. It will be appreciated that, in various embodiments, the power cabinet 112 suitably may include, but is not limited to, an EVSE power cabinet. However, it will be appreciated that each power cabinet 112 may include any number of DC power modules 114 as desired for a particular application. In various embodiments, an output conduit 115 electrically connects each DC power module 114 to an associated electric power dispenser 52 that is configured to provide electrical power to the vehicle 54.

In various embodiments the master controller 126 is configured to control the power output of each of the DC power modules 114. In various embodiments, the power cabinet 112 may use isolated power modules 114 that combine to achieve peak power outputs in excess of 300 kW. In such embodiments, the power cabinet 112 has the capability to charge over 20 vehicles in an overnight dwell scenario.

Figure 3B:
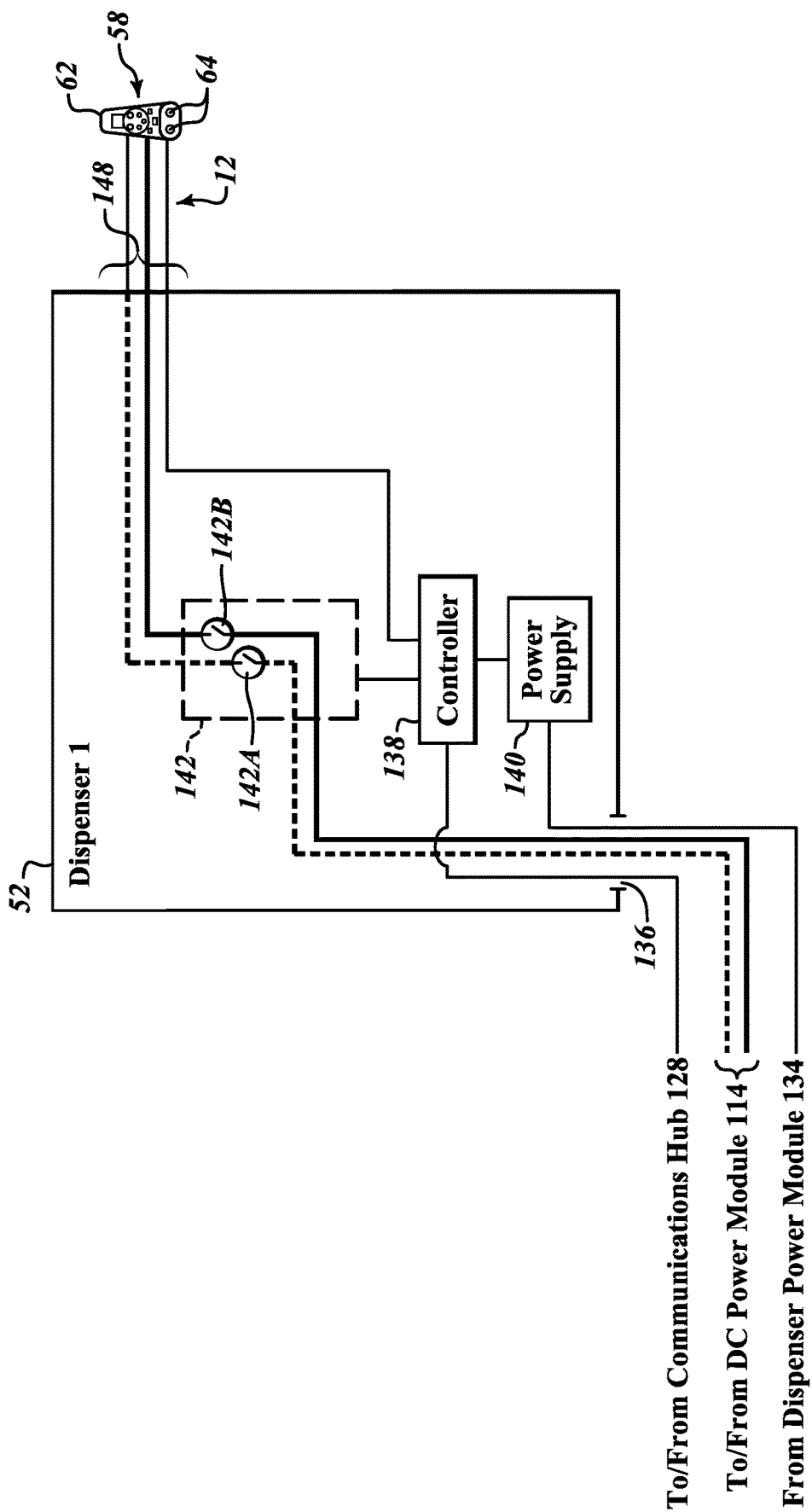
FIG. 3B is a block diagram of an illustrative DC electrical power dispenser of the charging system of FIG. 3A.

As shown in FIG. 3B, in various embodiments the dispenser 52 includes a conduit input 136, a controller 138, a power supply 140, the charge coupler 58, and a switching unit 142. The switching unit 142 includes switches 142A and 142B. The switching unit 142 may be controlled by the controller 138. The controller 138 and the switching unit 142 are configured to control providing control signals to and from the charge coupler 58 (via the switch 142A) and providing electrical power to the charge coupler 58 (via the switch 142B).

In various embodiments the master controller 126 (FIG. 3A) may be configured to generate control signals 144A, 144B, 144C, 144D, and 144E for the controller 138 of the dispensers 52 and thereby control the power output to each of the dispensers 52. Again, while five control signals are illustrated in this non-limiting example, it will be appreciated that any number of dispensers 58 and associated control signals may be used as desired for a particular application. The communications hub 128 may be configured to provide the controllers 138 with the control signals 144A, 144B, 144C, 144D, and 144E from the master controller 126. The communications hub 128 may also be configured with a communications network connection which may be wired or wireless. Each of the dispensers 58 may be individually addressed by the communications hub 128. Each of the dispensers 58 may also have dispenser identifiers associated therewith to facilitate communications (such as, without limitation, information regarding status of continuity of the electrical wiring 12 of any given dispenser 58) between the controller 138 and the communications hub 128.

In various embodiments the charge coupler 58 includes a housing 62. DC contacts 64 are disposed in the housing 62 and are configured to be electrically coupled to dispense DC electrical power to the electric vehicle 54 (FIG. 2). In such embodiments the electrical wiring 12 includes a control pilot wire 66 (FIG. 3C) disposed in the housing 62. As will be discussed below, the control pilot wire 66 is configured to receive a control pilot signal having a first frequency for low-level signaling, a powerline communication signal having a second frequency range for high-level communications, and a continuity check signal having a third frequency that is different from the first frequency and the second frequency range. A ground wire 68 (FIG. 3C) is disposed in the housing 62 and is configured to be electrically connectable to equipment ground. The controlled impedance network 18 is electrically connected between the control pilot wire 66 and the ground wire 68. As will be described below, the controlled impedance network 18 is configured to attenuate the continuity check signal.

Figure 3C:
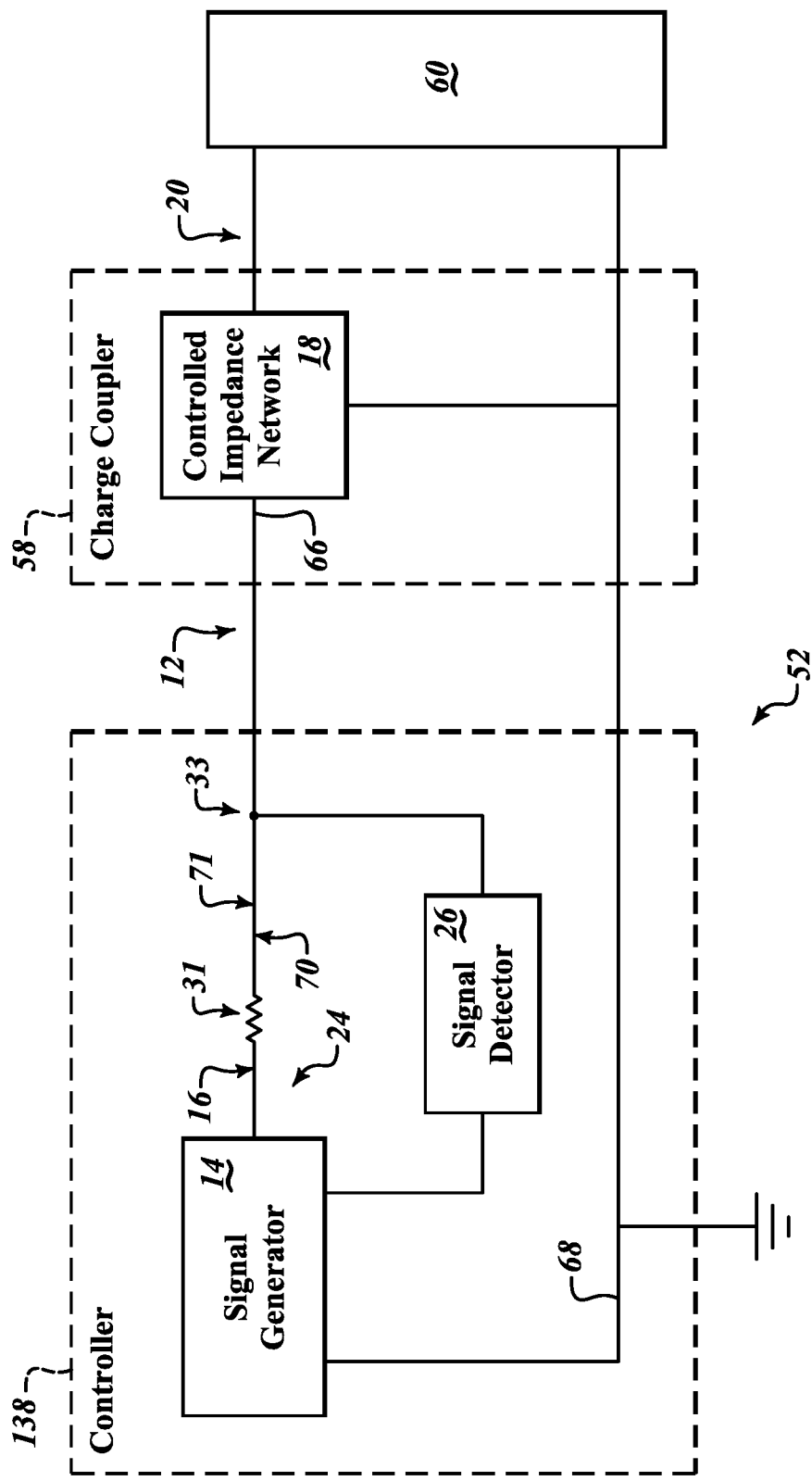
FIG. 3C is a block diagram of details of the dispenser of FIG. 3B.

As shown in FIG. 3C, the dispenser 52 includes the signal generator 14. It will be appreciated that the signal generator 14 may include more than one signal generator as desired for a particular application. The signal generator 14 is configured to generate a control pilot signal 70 having a first control pilot frequency for low-level signaling, a powerline communication signal 71 having a second frequency range for high-level communications, and a continuity check signal 16 having a third frequency that is different from the first frequency and the second frequency range. It will be appreciated that, in various embodiments, the continuity check signal 16 may be generated and injected onto the electrical wiring 12 while generation of the control pilot signal 70 and the powerline communication signal 71 is disabled. The signal detector 26 is configured to detect the continuity check signal 16. The cable assembly 148 includes the control pilot wire 66 electrically coupled to receive the control pilot signal 70, the powerline communication signal 71, the continuity check signal 16, and the ground wire 68 electrically connectable to equipment ground. The charge coupler 58 is coupled to an end of the cable assembly 148. The charge coupler 58 includes the housing 62. The controlled impedance network 18 is disposed in the housing 62 and is electrically connected between the control pilot wire 66 and the ground wire 68. The controlled impedance network 18 is configured to attenuate the continuity check signal 16.

The signal detector 26 measures the signal 16 at the node 33 after the resistor 31 that is disposed between the output of the signal generator 14 and the node 33. In some embodiments, the resistor 31 suitably has a value of 1 KS/per SAE J1772.

As shown in FIG. 3D, the control pilot signal 70 is sourced by the signal generator 14 and is injected onto the electrical wiring 12. The electrical wiring 12 is the primary control conductor and is connected to equipment ground through control circuitry (not shown) on the vehicle. The control pilot signal 70 performs the following functions: (i) verifies the vehicle is present and connected; (ii) prevents energization/de-energization of the supply; (iii) transmits supply equipment current rating to the vehicle; (iv) monitors presence of equipment ground; and (v) establishes vehicle ventilation requirements.

In various embodiments the control pilot signal 70 has a first control pilot frequency for low-level signaling. The low-level signaling component of the control pilot signal 70 suitably is a square wave signal having a frequency of around 1 KHz and peak voltages of +12V and −12V per SAE J1772. In various embodiments the control pilot signal 70 may be pulse width modulated between 0% and 100%. The low-level signaling component of the control pilot signal 70 communicates information regarding vehicle/EVSE states of a charging sequence per SAE J1772 (that is, states A (vehicle not connected), B1 (vehicle connected but not ready to accept energy, EVSE not ready to supply energy), B2 (vehicle connected but not ready to accept energy, EVSE capable to supply energy), C (vehicle connected and ready to accept energy, indoor charging air ventilation not required, EVSE capable to supply energy), D (vehicle connected and ready to accept energy, indoor charging air ventilation required, EVSE capable to supply energy), E (EVSE disconnected from vehicle and utility, EVSE loss of utility power or control pilot short to control pilot reference), and F (other EVSE problem)). The voltage level corresponds to the state (+12V=A, +9V=B1 both at 100% Duty Cycle, and B2 +6V with pulse width modulation) and the duty cycle 9.5%-96.5% displays the maximum current offered by the EVSE (6A up to 80A). A duty cycle of 5% indicates a digital communication request from the EVSE to the electric vehicle. This initiates high level communication through powerline communications (PLC) via the powerline communication signal 71 as discussed below.

As mentioned above, a duty cycle of 5% indicates a digital communication request from the EVSE to the electric vehicle. This initiates high level communication through powerline communications (PLC) via the powerline communication signal 71, such as without limitation via the HomePlug Green PHY communication protocol. Thus, it will be appreciated that the control pilot signal 70 and the powerline communication signal 71 are both injected on the same electrical wiring 12—and, sometimes, simultaneously. Regardless, it will be appreciated that, in various embodiments, the continuity check signal 16 may be generated and injected onto the electrical wiring 12 while generation of the control pilot signal 70 and the powerline communication signal 71 is disabled.

Figure 3E:
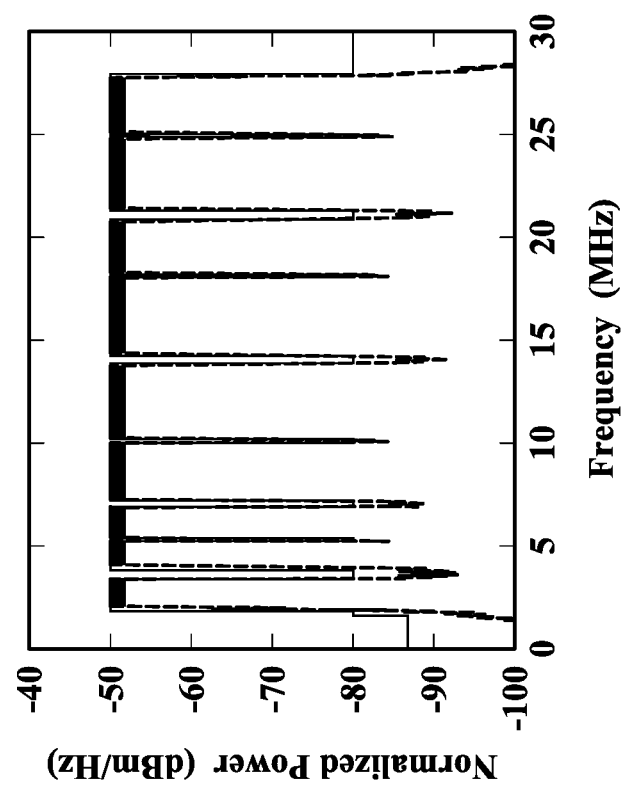
FIG. 3E is a spectrum mask for an illustrative control pilot signal for high-level communications.

As shown in FIG. 3E, in various embodiments the powerline communication signal 71 is a wideband signal that has a second frequency range for high-level communications per ISO-15118. In various embodiments the powerline communication signal 71 suitably is a wideband powerline communication signal between 2 MHz and 28 MHz that uses HomePlug Green PHY powerline communications technology to modulate the powerline communication signal 71 onto a suitable HomePlug carrier signal. HomePlug Green PHY communication acts independently of the 1 kHz control pilot signal 70. As such, it will be appreciated that in various embodiments the control pilot signal 70 and the powerline communication signal 71 are injected onto the electrical wiring 12 simultaneously.

It will be appreciated that the powerline communication signal 71 provides signal level attenuation characterization (SLAC) protocol (to measure signal strength of a signal between HomePlug Green PHY stations) and ISO 15118 messages (that is, an application layer message set designed to support energy transfer from an EVSE to an EV; also known as V2G messages).

As shown in FIGS. 4A-4C, in some embodiments the controlled impedance network 18 includes the low pass filter 18A. As shown in FIG. 4B, the cutoff frequency $f_c$ is above the frequency of the low-level signaling control pilot signal 70 (as indicated by line 72 at 1 KHz) and the frequency range of the high-level communications signal 71 (as indicated by region 74 between 2 MHz and 28 MHz). In the non-limiting example given by way of illustration only, the cutoff frequency $f_c$ is around 159 MHz and the capacitor 30 has a value of around 1 pF. As mentioned above, the resistor 31 has a value of 1 KΩ per SAE J1772. In some embodiments, the current-limiting resistance of the resistor 31 may be deemed sufficient and the optional resistor 32 is not used. However, in some other embodiments the optional resistor 32 suitably may be used if desired for a particular application.

It will be appreciated that the cutoff frequency $f_c$ of around 159 MHz is sufficiently higher than the highest frequency in either the control pilot signal 70 or the high-level communications signal 71 such that the low-level signaling control pilot signal 70 and the high-level communications signal 71 will not be affected by the low pass filter 18A. Instead, the signal 16 (which suitably is any signal with a frequency at least as high as the cutoff frequency $f_c$) will be attenuated sufficiently to not interfere with the low-level signaling control pilot signal 70 or the high-level communications signal 71. Given by way of non-limiting example, in various embodiments the signal 16 may have a frequency of around 800 KHz. In some such embodiments and, again, given by way of non-limiting example, the signal 16 may have a frequency of around 795.7 KHz.

As shown in FIG. 4B, it will be appreciated that the higher the frequency of the signal 16 the greater the attenuation of the signal 16 by the low pass filter 18A. It will also be appreciated that the passive, single pole low pass filter 18A is given by way of illustration only and not of limitation. For example, in various embodiments the low pass filter 18A may be a passive filter with more than a single pole. As another example, in various other embodiments the low pass filter 18A may be an active low pass filter, as desired for a particular application.

As shown in FIGS. 5A-5E, in some embodiments the controlled impedance network 18 includes the notch filter 18B. As shown in FIG. 5B, the center frequency $f_0$ is between the frequency of the low-level signaling control pilot signal 70 (as indicated by the line 72 at 1 KHz) and the frequency range of the high-level communications signal 71 (as indicated by the region 74 between 2 MHz and 28 MHz). In the non-limiting example given by way of illustration only, the center frequency $f_0$ is around 795.7 KHz, the capacitor 34 has a value of around 200 pF, and the inductor 36 has a value of 200 µH. As mentioned above, the resistor 31 has a value of 1 KΩ per SAE J1772. In some embodiments, the current-limiting resistance of the resistor 31 may be deemed sufficient and the optional resistor 38 is not used. However, in some other embodiments the optional resistor 38 suitably may be used if desired for a particular application.

It will be appreciated that the center frequency $f_c$ of around 795.7 KHz is sufficiently higher than the 1 KHz frequency of the low-level signaling component of the control pilot signal 70 and is sufficiently lower than the lowest frequency (2 MHz) of the high-level communications component of the control pilot signal 70 such that neither the low-level signaling component of the control pilot signal 70 nor the high-level communications component of the control pilot signal 70 will be affected by the notch filter 18B. Instead, the signal 16 (which suitably is any signal with a frequency near the cutoff frequency $f_c$) will be attenuated sufficiently to not interfere with the low-level signaling component of the control pilot signal 70 and the high-level communications component of the control pilot signal 70. As mentioned above and given by way of non-limiting example, in various embodiments the signal 16 may have a frequency of around 800 KHz. In some such embodiments and, again, given by way of non-limiting example, the signal 16 may have a frequency of around 795.7 KHz.

Figure 5D:
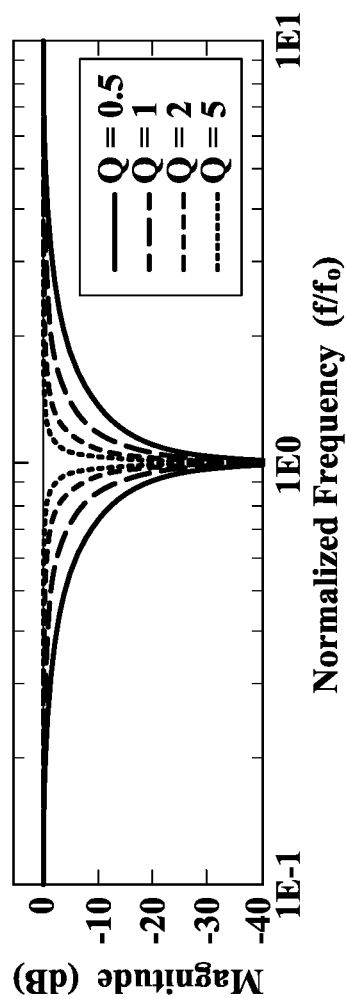
Figure 5E:
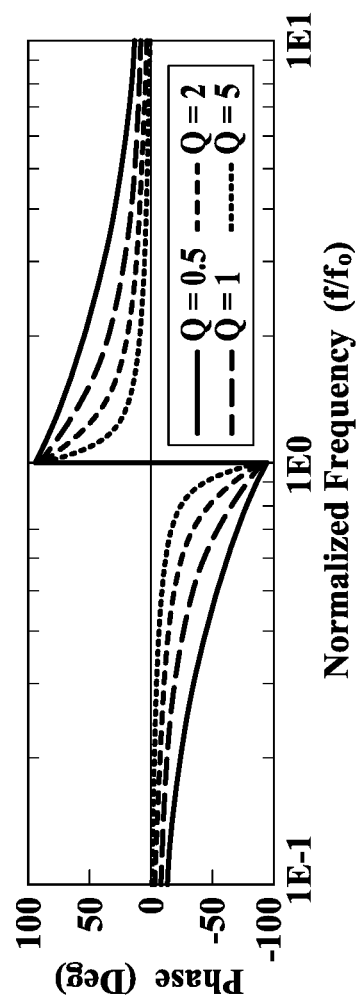

As shown FIGS. 5D and 5E, it will be appreciated that the higher quality factor Q of the notch filter 18B the higher selectivity
where $$Q = \frac{1}{\omega_0 RC} = \frac{\omega_0 L}{R}$$

ω0 is wavelength of the center frequency $f_c$

R is resistance of the resistor 38

C is capacitance of the capacitor 34

L is inductance of the inductor 36

That is, a higher quality factor Q results in a narrower stop band and a steeper transition to pass bands.

It will also be appreciated that the passive, second order notch filter 18B is given by way of illustration only and not of limitation. For example, in various embodiments the notch filter 18B may be a passive filter of a higher order than a second order notch filter. As another example, in various other embodiments the notch filter 18B may be an active notch filter, as desired for a particular application.

Regardless of whether the controlled impedance network 18 includes the low pass filter 18A or notch filter 18B, it will be appreciated that continuity (that is, no breaks in the electrical wiring 12 including the ground wires) can be distinguished from discontinuity (that is, a break in the electrical wiring 12 including the ground wires). Continuity is detected when the signal 16 is injected, is attenuated by the controlled impedance network 18, and the signal detector 26 measures the attenuated signal. Discontinuity is detected when the signal 16 is injected and the signal detector 26 measures a full strength signal with little, minimal, or no attenuation.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

The term module, as used in the foregoing/following disclosure, may refer to a collection of one or more components that are arranged in a particular manner, or a collection of one or more general-purpose components that may be configured to operate in a particular manner at one or more particular points in time, and/or also configured to operate in one or more further manners at one or more further times. For example, the same hardware, or same portions of hardware, may be configured/reconfigured in sequential/parallel time(s) as a first type of module (e.g., at a first time), as a second type of module (e.g., at a second time, which may in some instances coincide with, overlap, or follow a first time), and/or as a third type of module (e.g., at a third time which may, in some instances, coincide with, overlap, or follow a first time and/or a second time), etc. Reconfigurable and/or controllable components (e.g., general purpose processors, digital signal processors, field programmable gate arrays, etc.) are capable of being configured as a first module that has a first purpose, then a second module that has a second purpose and then, a third module that has a third purpose, and so on. The transition of a reconfigurable and/or controllable component may occur in as little as a few nanoseconds, or may occur over a period of minutes, hours, or days.

In some such examples, at the time the component is configured to carry out the second purpose, the component may no longer be capable of carrying out that first purpose until it is reconfigured. A component may switch between configurations as different modules in as little as a few nanoseconds. A component may reconfigure on-the-fly, e.g., the reconfiguration of a component from a first module into a second module may occur just as the second module is needed. A component may reconfigure in stages, e.g., portions of a first module that are no longer needed may reconfigure into the second module even before the first module has finished its operation. Such reconfigurations may occur automatically, or may occur through prompting by an external source, whether that source is another component, an instruction, a signal, a condition, an external stimulus, or similar.

For example, a central processing unit of a personal computer may, at various times, operate as a module for displaying graphics on a screen, a module for writing data to a storage medium, a module for receiving user input, and a module for multiplying two large prime numbers, by configuring its logical gates in accordance with its instructions. Such reconfiguration may be invisible to the naked eye, and in some embodiments may include activation, deactivation, and/or re-routing of various portions of the component, e.g., switches, logic gates, inputs, and/or outputs. Thus, in the examples found in the foregoing/following disclosure, if an example includes or recites multiple modules, the example includes the possibility that the same hardware may implement more than one of the recited modules, either contemporaneously or at discrete times or timings. The implementation of multiple modules, whether using more components, fewer components, or the same number of components as the number of modules, is merely an implementation choice and does not generally affect the operation of the modules themselves. Accordingly, it should be understood that any recitation of multiple discrete modules in this disclosure includes implementations of those modules as any number of underlying components, including, but not limited to, a single component that reconfigures itself over time to carry out the functions of multiple modules, and/or multiple components that similarly reconfigure, and/or special purpose reconfigurable components.

In some instances, one or more components may be referred to herein as "configured to," "configured by," "configurable to," "operable/operative to," "adapted/adaptable," "able to," "conformable/conformed to," etc. Those skilled in the art will recognize that such terms (for example "configured to") generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (for example, "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (for example, the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software (e.g., a high-level computer program serving as a hardware specification), firmware, or virtually any combination thereof, limited to patentable subject matter under 35 U.S.C. 101. In an embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, limited to patentable subject matter under 35 U.S.C. 101, and that designing the circuitry and/or writing the code for the software (e.g., a high-level computer program serving as a hardware specification) and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

With respect to the appended claims, those skilled in the art will appreciate that recited operations therein may generally be performed in any order. Also, although various operational flows are presented in a sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

While the disclosed subject matter has been described in terms of illustrative embodiments, it will be understood by those skilled in the art that various modifications can be made thereto without departing from the scope of the claimed subject matter as set forth in the claims.

What is claimed is:

1. An electric vehicle charging system comprising:
    a dispenser configured to receive and dispense direct current (DC) electrical power, the dispenser including:
    at least one signal generator configured to generate a control pilot signal having a first frequency for low-level signaling, a powerline communication signal having a second frequency range for high-level communications, and a continuity check signal having a third frequency that is different from the first frequency and the second frequency range;
    a signal detector configured to detect the continuity check signal;
    a cable assembly including a control pilot wire electrically coupled to receive the control pilot signal, the powerline communication signal, and the continuity check signal and a ground wire electrically connectable to equipment ground; and
    a charge coupler coupled to an end of the cable assembly, the charge coupler including:
    a housing; and
    a controlled impedance network disposed in the housing and electrically connected between the control pilot wire and the ground wire, the controlled impedance network being configured to attenuate the continuity check signal.

2. The charging system of claim 1, wherein the controlled impedance network includes a low pass filter.

3. The charging system of claim 2, wherein the low pass filter has a cutoff frequency above the first frequency and the second frequency range.

4. The charging system of claim 1, wherein the controlled impedance network includes a notch filter.

5. The charging system of claim 4, wherein the notch filter has a stop band frequency range having a center frequency between the first frequency and the second frequency range.

6. The charging system of claim 1, wherein the first frequency is around 1 KHz and the second frequency range is between around 2 MHz and around 28 MHz.

7. A charge coupler for an electrical vehicle charging system, the charge coupler comprising:
- a housing;
- DC contacts disposed in the housing and configured to be electrically coupled to dispense DC electrical power to an electric vehicle;
- a control pilot wire disposed in the housing, the control pilot wire being configured to receive a control pilot signal having a first frequency for low-level signaling, a powerline communication signal having a second frequency range for high-level communications, and a continuity check signal having a third frequency that is different from the first frequency and the second frequency range;
- a ground wire disposed in the charge coupler housing, the ground wire being configured to be electrically connectable to equipment ground; and
- a controlled impedance network electrically connected between the control pilot wire and the ground wire, the controlled impedance network being configured to attenuate the continuity check signal.

8. The charge coupler of claim 7, wherein the controlled impedance network includes a low pass filter.

9. The charge coupler of claim 8, wherein the low pass filter has a cutoff frequency above the first frequency and the second frequency range.

10. The charge coupler of claim 7, wherein the controlled impedance network includes a notch filter.

11. The charge coupler of claim 10, wherein the notch filter has a stop band frequency range having a center frequency between the first frequency and the second frequency range.

* * * * *